United States Patent
Ito

(10) Patent No.: US 10,263,208 B2
(45) Date of Patent: Apr. 16, 2019

(54) ORGANIC ELECTRO-LUMINESCENT DISPLAY DEVICE

(71) Applicant: Japan Display Inc., Minato-ku (JP)

(72) Inventor: Masato Ito, Minato-ku (JP)

(73) Assignee: Japan Display Inc., Minato-ku (JP)

(*) Notice: Subject to any disclaimer, the term of this patent is extended or adjusted under 35 U.S.C. 154(b) by 0 days.

(21) Appl. No.: 15/646,251

(22) Filed: Jul. 11, 2017

(65) Prior Publication Data

US 2018/0069187 A1 Mar. 8, 2018

(30) Foreign Application Priority Data

Sep. 7, 2016 (JP) .................. 2016-174396

(51) Int. Cl.
*H01L 51/50* (2006.01)
*H01L 51/05* (2006.01)
*H01L 51/52* (2006.01)

(52) U.S. Cl.
CPC ...... *H01L 51/5012* (2013.01); *H01L 51/0545* (2013.01); *H01L 51/524* (2013.01); *H01L 51/0508* (2013.01); *H01L 51/5293* (2013.01)

(58) Field of Classification Search
CPC ............ H01L 51/5012; H01L 51/0545; H01L 51/524; H01L 51/0508; H01L 51/5293
See application file for complete search history.

(56) References Cited

U.S. PATENT DOCUMENTS

2003/0230972 A1* 12/2003 Cok .................... H01L 27/3211
313/504
2008/0023724 A1 1/2008 Takeda et al.

FOREIGN PATENT DOCUMENTS

JP 2006-302879 11/2006

* cited by examiner

*Primary Examiner* — Anne M Hines
(74) *Attorney, Agent, or Firm* — Oblon, McClelland, Maier & Neustadt, L.L.P.

(57) ABSTRACT

An organic electroluminescent display device according to an embodiment of the present invention includes a lower electrode, an upper electrode, an organic EL layer positioned between the lower electrode and the upper electrode and a light emitting material containing layer that contains a light emitting material and is arranged on an opposite side of the upper electrode from the organic EL layer.

12 Claims, 4 Drawing Sheets

ORGANIC ELECTRO-LUMINESCENT DISPLAY DEVICE

CROSS-REFERENCE TO RELATED APPLICATION

The present application claims priority from Japanese Application JP2016-174396 filed on Sep. 7, 2016, the content of which is hereby incorporated by reference into this application.

BACKGROUND OF THE INVENTION

1. Field of the Invention

One or more embodiments of the present invention relate to an organic electroluminescent display device.

2. Description of the Related Art

Recent years, an image display device that uses a self-luminous body called an organic light emitting diode (OLED) (hereinafter referred to as an "organic EL (Electro-Luminescent) display device") is put into practical use. The organic EL display device is, for example, as compared with a liquid crystal display device, due to its usage of a self-luminous body, superior in its visibility and response speed, and moreover it can be formed thin since it does not need a lighting device such as a backlight.

As to an organic EL display, various considerations have been made in order to improve a light emitting efficiency. For example, as in Japanese Patent Application Laid-Open No. 2006-302879, a method to provide a capping layer is proposed.

SUMMARY OF THE INVENTION

While according to the method as described above, light from an organic light emitting diode can be output to the outside efficiently to improve the light emitting efficiency, a further improvement of the light emitting efficiency is demanded. Regarding this, one or more embodiments of the present invention realize an organic EL display device with an excellent light emitting efficiency.

An organic electroluminescent display device according to one embodiment of the present invention includes a lower electrode, an upper electrode, an organic EL layer positioned between the lower electrode and the upper electrode and a light emitting material containing layer that contains a light emitting material and is arranged on an opposite side of the upper electrode from the organic EL layer.

In one embodiment of the present invention, the light emitting material is configured to emit light when the light emitting material is irradiate light that the organic EL layer emits.

In one embodiment of the present invention, the light emitting material containing layer contains a capping layer formation material having a refractive index equal to or larger than 1.75. Preferably, the capping layer formation material has a refractive index equal to or larger than 1.75 for light with a wavelength in a wavelength range of 380 nm to 780 nm.

In one embodiment of the present invention, the light emitting material containing layer includes a lamination structure where capping layers with different refractive indices are laminated.

In one embodiment of the present invention, the lamination structure includes a first capping layer and a second capping layer, a distance between the upper electrode and the second capping layer is larger than a distance between the upper electrode and the first capping layer, a refractive index of the first capping layer is larger than a refractive index of the second capping layer, and the light emitting material is contained at least in the first capping layer.

In one embodiment of the present invention, the light emitting material has a peak of a light emission wavelength, and the peak is included in a wavelength range of 440 nm to 480 nm.

In one embodiment of the present invention, the organic electroluminescent display device further includes pixels which are adjacent to each other, a color of each of the pixels is different from each other, and the first capping layer is arranged continuously in the pixels.

In one embodiment of the present invention, the organic electroluminescent display device further includes a blue pixel and a pixel of a color that is different from blue, the first capping layer is arranged in the blue pixel, and is not arranged in the pixel.

An organic electroluminescent display device according to another embodiment of the present invention includes a lower electrode, an upper electrode, an organic EL layer positioned between the lower electrode and the upper electrode, a first capping layer positioned on and in direct contact with the upper electrode, and a second capping layer positioned over the first capping layer. At least one of the first capping layer and the second capping layer contains a light emitting material.

In one embodiment of the present invention, the first capping layer includes an organic compound, and the second capping layer includes an inorganic compound.

DETAILED DESCRIPTION OF THE INVENTION

Figure 1:
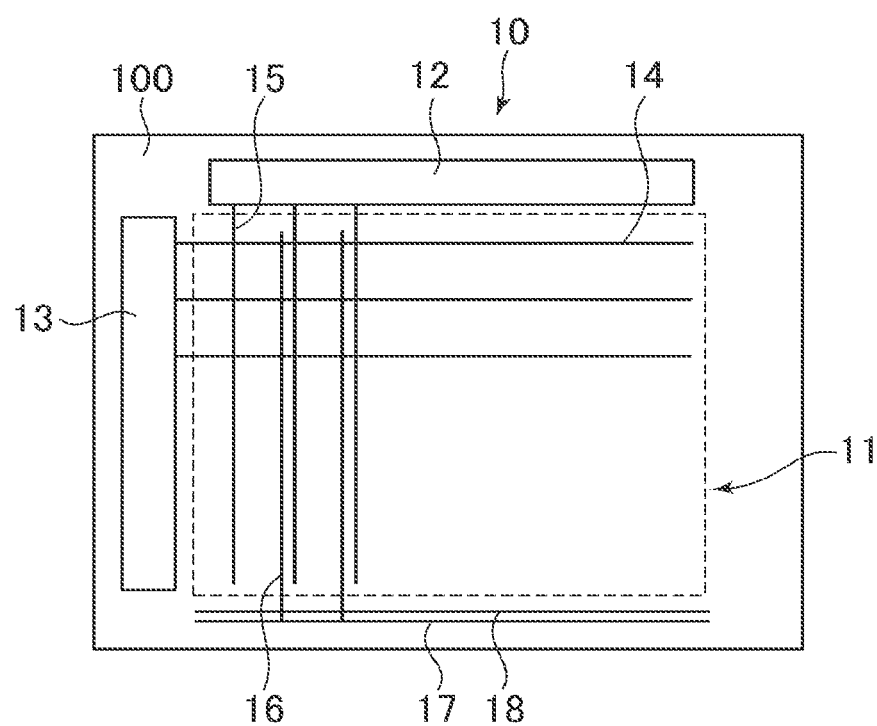
FIG. 1 is a schematic diagram illustrating an example of a circuit configuration of an organic EL display device.

Below, respective embodiments of the present invention are explained with reference to the accompanying drawings. The disclosed embodiments are merely examples, and appropriate variations within the spirit of the present invention that can be easily arrived at by those skilled in the art are naturally included in the scope of the present invention. Further, while the width, thickness, shape, and the like of each part in the drawings may be illustrated schematically as compared with actual embodiments in order to clarify the explanation, these are merely examples and an interpretation of the present invention should not be limited thereto.

Furthermore, in the specification and respective drawings, the same reference symbols may be applied to elements similar to those that have already been illustrated in another drawing and a detailed explanation of such elements may be omitted as appropriate.

Figure 2:
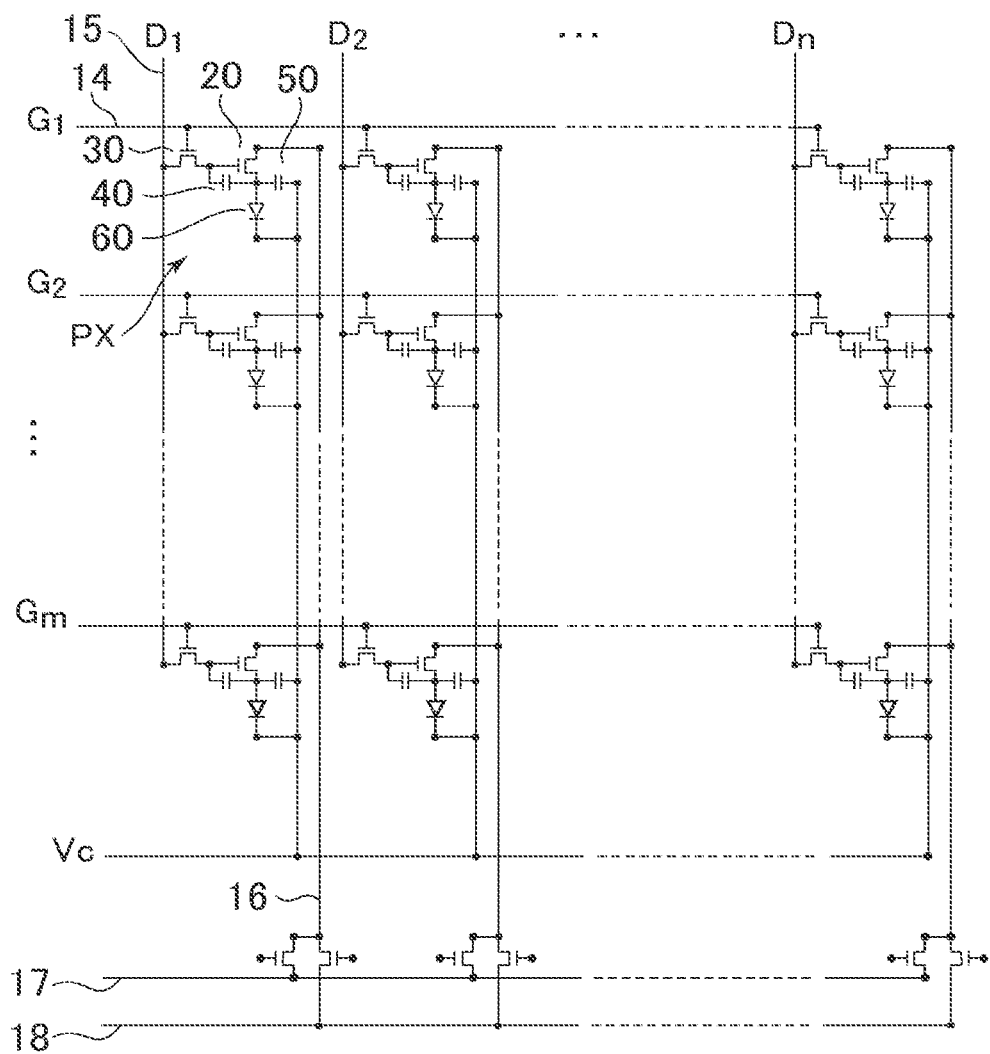
FIG. 2 is a diagram illustrating an example of a circuit diagram of the organic EL display device.

FIG. 1 is a schematic diagram illustrating an example of a circuit configuration of an organic EL display device, and FIG. 2 illustrates an example of a circuit diagram of the organic EL display device.

An organic EL display device 10 displays an image by controlling respective pixels formed in a display region 11 on a substrate 100, by a data driving circuit 12 and a scan driving circuit 13. Here, for example, the data driving circuit 12 is an IC (Integrated Circuit) that generates and transmits a data signal to be delivered to each pixel, and the scan driving circuit 13 is an IC that generates and transmit a gate signal for a TFT (Thin Film Transistor) provided in the pixel. In FIG. 1, the data driving circuit 12 and the scan driving circuit 13 are arranged in two places, but they may be incorporated into one IC, and may be formed by a circuit arranged directly on the substrate 100.

A scanning line 14 that transmits a signal from the scan driving circuit 13 is connected to a gate electrode of a switch transistor 30 as illustrated in FIG. 2. Further, a data line 15 that transmits a signal from the data driving circuit 12 is connected to a source/drain electrode of the switch transistor 30. A reference electric potential to have an organic light emitting diode 60 emit light is applied to an electric potential line 16, and the electric potential line 16 is connected to a source/drain electrode of a driver transistor 20. A first electric potential supply line 17 and a second electric potential supply line 18 are connected to an electric potential supply source, and is connected to the electric potential line 16 via a transistor. Note that a configuration illustrated in FIG. 2 is merely an example, and the present embodiment is not limited thereto.

As illustrated, in the display region 11 of the organic EL display device 10, n data lines 15 are formed, D1 to Dn, and m scanning lines 14 are formed, G1 to Gm. A plurality of pixels PX are arranged in a matrix in the extending direction of the scanning lines 14 and in the extending direction of the data lines 15. For example, a pixel PX is formed in a part surrounded by G1 and G2, and D1 and D2.

The first scanning line G1 is connected to the gate electrode of the switch transistor 30, and when a signal from the scan driving line 13 is applied thereto, the switch transistor 30 is turned to an ON state. Then if a signal is applied to the first data line D1 from the data driving circuit 12, electric charge is stored in a storage capacitance 40, an electric voltage is applied to a gate electrode of the driver transistor 20, and the driver transistor 20 is turned to an ON state. At this time, even if the switch transistor 30 is turned to an OFF state, the driver transistor 20 is in an ON state for a certain period of time due to the electric charge stored in the storage capacitance 40. Since an anode of the organic light emitting diode 60 is connected to the electric potential line 16 via the source and drain of the driver transistor 20 and a cathode of the organic light emitting diode 60 is fixed at a reference voltage Vc, an electric current runs in the organic light emitting diode 60 in accordance with a gate voltage of the driver transistor 20, and the organic light emitting diode 60 emits light. Further, for example, an additional capacitance 50 is formed between the anode and the cathode of the organic light emitting diode 60. The additional capacitance 50 exhibits an effect of stabilizing the voltage written into the storage capacitance 40, and contributes to a stabilized operation of the organic light emitting diode 60. Specifically, this effect is exhibited by making the electrostatic capacitance of the additional capacitance 50 larger than that of the electrostatic capacitance of the storage capacitance 40.

Figure 3:
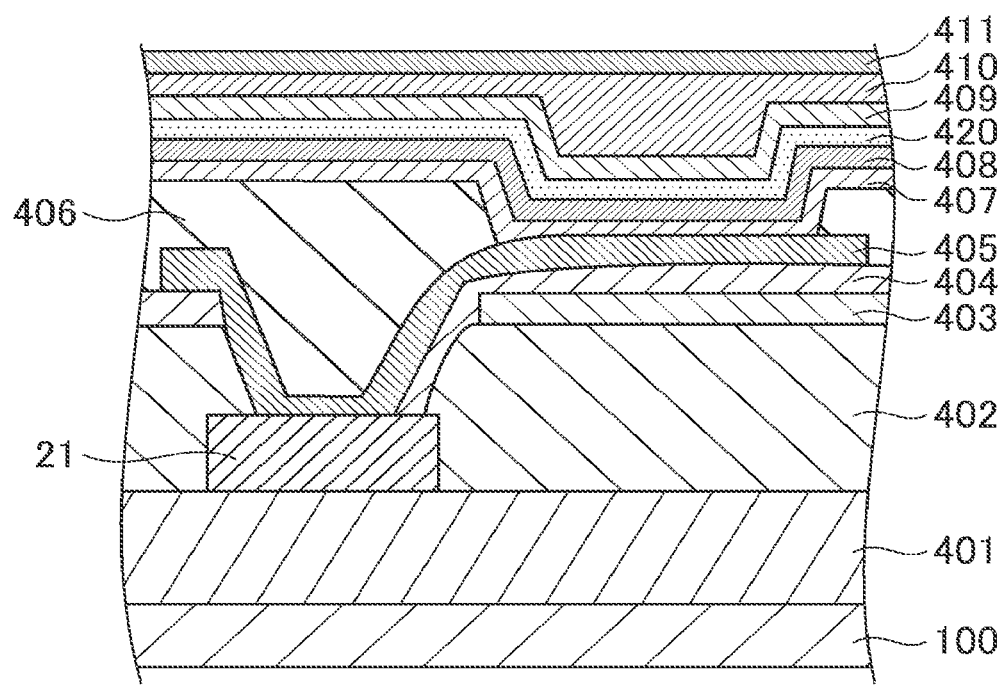
FIG. 3 is a cross sectional diagram illustrating a part of a cross section of an organic EL element structure in a first embodiment of the present invention.

FIG. 3 is a cross sectional diagram illustrating a part of a cross section of the organic EL element structure in the first embodiment of the present invention. Note that the configuration illustrated in FIG. 3 is merely an example, and the present embodiment is not limited to the configuration illustrated in FIG. 3.

As illustrated in FIG. 3, a TFT layer 401 on which a TFT and the like to drive the pixels are formed is provided on the substrate 100, and a planarizing layer 402 is formed on the TFT layer 401. A metal layer 403, an insulating layer 404, and an anode electrode 405 (a lower electrode) are formed in this order on the planarizing layer 402. The metal layer 403, for example, contains Al, and reflects light from an organic EL layer 407 (a light emitting layer) to be described later on a surface of the metal layer 403.

The metal layer 403 may be used as an auxiliary line of a power supply line of the cathode electrode 408, by electrically connecting a cathode electrode 408 (an upper electrode) to be described later to the metal electrode 403. Further, a capacitance layer (the additional capacitance 50) may be formed by having the metal layer 403 and the anode electrode 405 hold the insulating layer 408 between themselves. The electric connection of the metal layer 403 and the cathode electrode 408 is made, for example, by arranging a through hole outside the display region. The insulating layer 404 is formed of, for example, $SiN_x$. The anode electrode 405 is formed of a transparent conductive material such as ITO (Indium Tin Oxide), IZO (Indium Zinc Oxide), or the like. Further, instead of providing the metal line 403, the anode electrode 405 may be formed of a lamination structure of ITO and metal, such as a lamination structure constituted by three layers, namely, ITO, silver, and ITO.

In the planarizing layer 402, as illustrated in FIG. 3, a through hole to the source electrode 21 is formed. The source electrode 21 is an electrode that is connected to a source region of the TFT (not illustrated) provided in the TFT layer 401. At the bottom of this through hole, the anode electrode 405 and the source electrode 21 are connected to each other.

On the structure as described above, a bank layer 406 is formed that separates the pixels and at the same time covers a part of the anode electrode 405, and on the bank layer 406 and the anode electrode 405, the organic EL layer 407 is formed. Here, a region where the anode electrode 405 and the organic EL layer 407 contact with each other becomes the light emitting region, and the bank layer 406 defines an outer edge of the light emitting region.

On the organic EL layer 407, the cathode electrode 408 is formed. The cathode electrode 408 is formed of, for example, a semi-transparent conductive material such as an Mg—Ag alloy or a transparent conductive material such as ITO and IZO. The cathode electrode 408 may be formed continuously in more than one of the pixels PX, or in all of the pixels PX arranged in a matrix.

On the cathode electrode 408, a light emitting material containing layer 420 is formed. The detail of the light emitting material containing layer 420 is described later.

On the light emitting material containing layer 420, a sealing layer is formed. Specifically, a first sealing film 409 is provided, on the first sealing film 409, a second sealing film 410 containing an organic material is provided, and on the second sealing film 410, a third sealing film 411 is provided, to thereby form the sealing layer.

Figure 4:
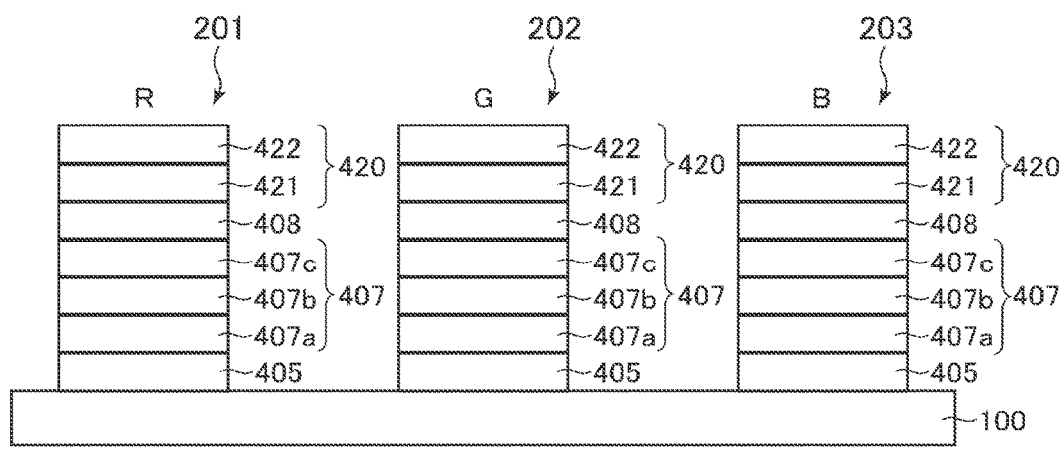
FIG. 4 is a layer configuration diagram comparatively illustrating respective light emitting elements of the organic EL display device in the first embodiment of the present invention.

FIG. 4 is a layer configuration diagram comparatively illustrating respective light emitting elements of the organic EL display device in the first embodiment of the present invention. On the substrate 100, a first light emitting element 201 (e.g., a red light emitting element), a second light emitting element 202 (e.g., a green light emitting element), and a third light emitting element 203 (e.g., a blue light emitting element) are formed. Note that one light emitting element in FIG. 4 corresponds to the element structure illustrated in FIG. 3, and in FIG. 4, the substrate 100, the anode electrode 405, the organic EL layer 407, the cathode electrode 408, and the light emitting material containing layer 420 are illustrated from among the components illustrated in FIG. 3.

The respective light emitting elements 201, 202, and 203 includes a lamination structure provided with the anode electrode 405, the organic EL layer 407, and the cathode electrode 408 in this order. On the light output side (a side from which light emitted from the organic EL layer is output) of this lamination structure, a light emitting material containing layer 420 that contains a light emitting material is formed. In the present embodiment, the light emitting material containing layer 420 is formed on the cathode electrode 408 (adjacent to the cathode electrode 408).

The organic EL layer 407 is formed by laminating, from the anode electrode 405 side, a hole transport layer 407a, a light emitting layer 407b, and an electron transport layer 407c in this order. Though not illustrated, the organic EL layer 407 may include another layer. As another layer, for example, a hole injection layer and an electron block layer that are arranged between the anode electrode and the light emitting layer, and an electron injection layer and a hole block layer that are arranged between the cathode electrode and the light emitting layer can be mentioned.

As the light emitting material contained in the light emitting material containing layer 420, typically, a material is used that emits light when the light emitted by the organic EL layer 407 (the light emitting layer 407b) is irradiated onto it. For example, as the light emitting material, a dopant material contained in the light emitting layer 407b is used. Like this, by separately forming a layer that can emit light, the light emitting efficiency can be improved.

The light emitting materials contained in the light emitting material containing layers 420 of the respective light emitting elements may be the same with and may be different from one another. In one embodiment, a same light emitting material is contained in the light emitting material containing layers 420 of the respective light emitting elements 201, 202, and 203. In the mode like this, for example, a film formation efficiency of the light emitting material containing layer 420 can be improved. Specifically, the light emitting material containing layer 420 can be formed continuously in pixel regions of a plurality of colors. As a light emitting material used in the mode like this, a light emitting material is preferably used whose emission wavelength or the peak of whose emission wavelength is in the wavelength range of 440 nm to 480 nm (a blue region), since there occurs no emission of the light of a wavelength larger than an emission wavelength of the light emitting material (specifically, no emission of the light occurs in a red pixel region and a green pixel region). As light emitting materials that satisfy the emission wavelength as described above, for example, 2,5,8,11-tetra-tert-butylperylene, 4,4'-bis[4-(di-p-tolylamino)styryl]biphenyl, and 4,4'-bis[4-(diphenylamino) styryl]biphenyl can be mentioned. Moreover, with the use of a light emitting material like these that emits light in the blue region, the light emitting material containing layer 420 can function as a capping layer (which can also be referred to as an optical path adjustment layer, or a cap layer) as described later. The capping layer described here is a layer provided over the anode electrode 405. It is a layer that has a function to generate an optical interfering component by reflecting light between the capping layer and the anode electrode 405 or between the capping layer and the cathode electrode 408 and enable to strengthen the optical resonance, that is, a function to improve the light utilization efficiency.

For example, using a light emitting material that emits light in the blue region for the light emitting material containing layer 420, the thickness of the light emitting material containing layer 420 can be set so that the optical resonance becomes strong at a wavelength of another color (e.g., green) to optimize the light utilization efficiency. In such a mode, the blue light emitting element can improve the light emitting efficiency as the light emitting material emits light in the blue region, and the light emitting element of another color can improve the light utilization efficiency as the thickness of the light emitting material is set so that the optical resonance becomes strong. Note that it may be configured that the thickness of the light emitting material containing layer 420 is set so that the optical resonance becomes strong at the wavelength of blue, and the light emitting efficiency of the blue light emitting element is selectively improved.

In another embodiment, the light emitting material containing layers 420 of the respective light emitting elements 201, 202, and 203 contain light emitting materials that correspond to the colors of the respective light emitting elements. For example, the light emitting material containing layer 420 included in the first light emitting element (the red light emitting element) 201 contains a light emitting material whose emission wavelength or the peak of whose emission wavelength is in the wavelength range of 580 nm to 630 nm, the light emitting material containing layer 420 included in the second light emitting element (the green light emitting element) 202 contains a light emitting material whose emission wavelength or the peak of whose emission wavelength is in the wavelength range of 500 nm to 570 nm, and the light emitting material containing layer 420 included in the third light emitting element (the blue light emitting element) 203 contains a light emitting material whose emission wavelength or the peak of whose emission wavelength is in the wavelength range of 440 nm to 480 nm. According to such a mode, for example, the light emitting efficiency can be improved at all the colors. In this case, the thicknesses of the light emitting material containing layers 420 of the respective light emitting elements 201, 202, and 203 may be the same with and may be different from one another (may be set in accordance with the wavelengths of the colors of the respective light emitting elements).

The light emitting material containing layer 420 may contain any other material that is appropriate. Preferably, the light emitting material containing layer 420 contains a capping layer formation material. Specifically, the light emitting material containing layer 420 may function as the capping layer. To obtain the function of the capping layer as described above, it is necessary, with respect to incident light, to form it with an optimal film thickness and at the same time use a material with an optimal refractive index, since by setting the refractive index optimally, the light path length can be adjusted so as to strengthen the optical resonance. According to such a mode, the light extraction efficiency can still be improved. As a result, the light emissivity of the light emitting material can be enhanced. As the capping layer formation material, for example, a material with a refractive index equal to or larger than 1.75 for light of a wavelength in the wavelength range of 380 nm to 780 nm is used. In this case, as specific examples of the capping layer formation material, organic compounds such as 4,4'-bis[N-(3-methylphenyl)-N-phenylamino]biphenyl (TPD), 4,4',4''-tris[(3-methylphenyl)phenylamino]triphenylamine (m-MTDATA), and 1,3,5-tris[N,N-bis(2-methylphenyl)-amino]-benzene (o-MTDAB) can be mentioned. Note that a refractive index of the light emitting material containing layer 420 may be equal to or larger than 1.75. Further, there is a case where a material with a refractive index equal to or smaller than 1.50 for light of a wavelength in the wavelength range of 380 nm to 780 nm is used. As specific examples of the capping layer formation material in this case, inorganic compounds such as LiF (lithium fluoride) and $MgF_2$ (magnesium fluoride) can be mentioned. Note that a refractive index of the light emitting material containing layer 420 may be equal to or smaller than 1.50. Further, the other materials contained in the light emitting layers 420 of the respective light emitting elements may be the same and may be different from one another.

In the present embodiment, the light emitting material containing layers 420 of the respective light emitting elements 201, 202, and 203 have a lamination structure where the first capping layer 421, and the second capping layer 422 are laminated in this order from the cathode electrode 408 side, and the light emitting material is contained in the first capping layer 421 selectively. The content of the light emitting material in the first capping layer 421 is, for example, 0.5 parts by weight to 20 parts by weight with respect to 100 parts by weight of the capping layer formation material. The thicknesses of the respective capping layers may be set to any appropriate value. For example, the thicknesses of the respective capping layers 421 and 422 of the respective light emitting elements 201, 202, and 203 are set in accordance with wavelengths of specific colors or the colors of the respective light emitting elements. The thicknesses of the respective capping layers are set, for example, to 20 nm to 150 nm. Note that it may be configured that the light emitting material is contained only in one of the first capping layer 421 and the second capping layer 422, and that the light emitting material is contained in both of the first capping layer 421 and the second capping layer 422. Further, the first capping layer 421 may be disposed continuously in the light emitting elements 201, 202, and 203, and may be arranged separately for each of the light emitting elements 201, 202, and 203. In a case where it is arranged separately for each of the light emitting elements 201, 202, and 203, the respective first capping layers 421 that are separated contain light emitting materials that emit light of the colors of the corresponding light emitting elements 201, 202, and 203. The respective first capping layers 421 that are separated may have thicknesses different from one another so that the optical resonance becomes strong at the wavelengths of the corresponding colors.

In the present embodiment, a refractive index of the first capping layer 421 is set larger than that of the second capping layer 422. By setting the refractive index of the first capping layer whose distance to the cathode electrode 408 is smaller than that of the second capping layer 422 to be high (e.g., equal to or larger than 1.75 for light with a wavelength in the wavelength range of 380 nm to 780 nm), the light extraction efficiency can be enhanced and the light emissivity of the light emitting material contained in the first capping layer 421 can be still enhanced. In this case, it is preferable that for the first capping layer 421 with a high refractive index the material as described above having a refractive index equal to or larger than 1.75 is used, and for the second capping layer 422 with a low refractive index the material as described above having a refractive index equal to or smaller than 1.50 is used. Note that refractive indices of the respective capping layers may be set to any appropriate value. For example, the refractive index of the first capping layer 421 is set lower than that of the second capping layer 422. In this case, it may be configured that the first capping layer 421 does not contain the light emitting material, and the second capping layer 422 contains the light emitting material. The second capping layer 422 may be disposed continuously in the light emitting elements 201, 202, and 203, and may be arranged separately for each of the light emitting elements 201, 202, and 203. In a case where it is arranged separately for each of the light emitting elements 201, 202, and 203, the respective second capping layers 422 that are separated contain light emitting materials that emit light of the colors of the corresponding light emitting elements 201, 202, and 203. The respective second capping layers 422 that are separated may have thicknesses different from one another so that the optical resonance becomes strong at the wavelengths of the corresponding colors.

Further, unlike the illustrated example, at each light emitting element, the light emitting material containing layer 420 may have a single layered structure, and may have a lamination structure with three or more layers.

The lamination structure illustrated in FIGS. 3 and 4 is formed typically by laminating the respective layers on the substrate 100 by any appropriate method. The light emitting material containing layer 420 (the first capping layer 421) can be formed by any appropriate method in accordance with its formation material. For example, it is formed by co-depositing the light emitting material and another material (the capping layer formation material).

Even if the layer to contain the light emitting material is formed between the light emitting layer and an electrode (one of the upper electrode and the lower electrode), the light emitting material can be made to emit light depending on light emitted by the light emitting layer. However, in an arrangement like this, the light emitting material is arranged in a layer other than the light emitting layer in the organic EL layer, and thus a function of the hole block layer, the electron block layer, the hole injection layer, the hole transport layer, the electron injection layer, and the electron transport layer that are disposed together with the light emitting layer in the organic EL layer is degraded. In the present embodiment, the light emitting material containing layer 420 is arranged on the cathode electrode 408, that is, on the side of the cathode electrode 408 opposite from the organic EL layer 407. Therefore, the light emitting efficiency, and the light utilization efficiency can be improved without degrading the function of the electron transport layer, the electron injection layer, and the like. To greatly improve the light emitting efficiency, it is preferable that the light emitting material containing layer 420 is arranged as close as possible to the light emitting layer 407b. In the present embodiment, the light emitting material containing layer 420 is disposed on the cathode electrode 408 in direct contact with it, and therefore the light emitting efficiency can be greatly improved.

As the conventional technology, there is an arrangement to dispose the capping layer (the optical path adjustment layer) on the cathode electrode (the upper electrode). Accordingly, the present embodiment can be said to have an arrangement to contain the light emitting material in the capping layer (the optical path adjustment layer). In the present embodiment, it may be configured that the one of the first capping layer 421 and the second capping layer 422 illustrated in FIG. 4 contain the light emitting material, and that both of them contain the light emitting material. Regarding the fact that the light emitting material containing layer 420 is disposed as close as possible to the light emitting layer 407b, it is preferable that at least the first capping layer 421 that is in direct contact with the cathode electrode 408 includes the light emitting material.

Figure 5:
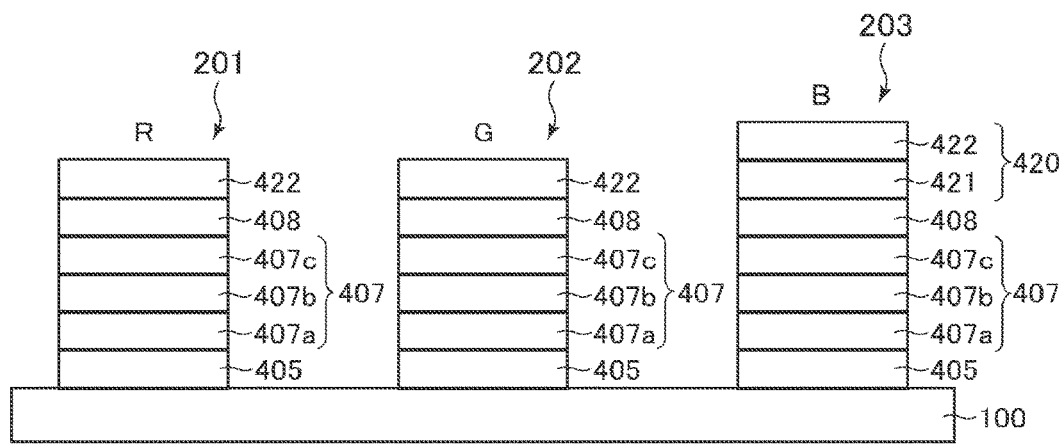
FIG. 5 is a layer configuration diagram comparatively illustrating respective light emitting elements of an organic EL display device in a second embodiment of the present invention.

FIG. 5 is a layer configuration diagram illustrating the respective light emitting elements of the organic EL display device in the second embodiment of the present invention. The present embodiment is different from the first embodiment as described above in that the light emitting material containing layer 420 (the first capping layer 421) is formed selectively in the third light emitting element 203. That is, it may be configured that the first capping layer 421 and the second capping layer 422 are arranged in the third light emitting element 203, and none of or one of the first light emitting element 201 and the second light emitting element 202 includes the first capping layer 421 but one of or both of them include the second capping layer 422. The second capping layer 422 is disposed continuously in the first light emitting element 201, the second light emitting element 202, and the third light emitting element 203. It may be configured that the first capping layer 421 contains the light emitting material that emits light of a color of the third light emitting element 203 (e.g., blue), and the second capping layer 422 does not include the light emitting material. According to such a configuration, the light emitting efficiency of the light emitting element of a specific color (e.g., blue) can be selectively improved.

In the embodiments as described above, although the light emitting material containing layer 420 functions as the capping layer, it simply may be a layer that contains the light emitting material or it may be provided with any other appropriate function. For example, the sealing layer as described above may contain the light emitting material to have the light emitting material containing layer 420 function as the sealing layer.

The present invention is not limited to the embodiments as described above, and various variations are possible. For example, the configurations shown in the embodiments as described above can be replaced with a configuration that is substantially the same with them, a configuration that exhibits the same working effect, or a configuration that can achieve the same goal.

Those skilled in the art should be able to arrive at various kinds of variations and modifications within the spirit of the present invention, ant it is understood that such variations and modifications are within the scope of the present invention. For example, addition, deletion, or design change of components, or by addition, omission, or condition change of processes made by those skilled in the art as appropriate in each embodiment as described above are also encompassed within the scope of the present invention as long as they fall within the spirit of the present invention.

What is claimed is:

1. An organic electroluminescent display device comprising:
 a lower electrode;
 an upper electrode;
 an organic EL layer positioned between the lower electrode and the upper electrode; and
 a light emitting material containing layer that contains a light emitting material and is arranged on an opposite side of the upper electrode from the organic EL layer,
 wherein the light emitting material containing layer includes a lamination structure where capping layers with different refractive indices are laminated.

2. The organic electroluminescent display device according to claim 1, wherein the light emitting material containing layer contains a capping layer formation material having a refractive index equal to or larger than 1.75 for light with a wavelength in a wavelength range of 380 nm to 780 nm.

3. The organic electroluminescent display device according to claim 1, wherein a refractive index of the light emitting material containing layer is equal to or larger than 1.75.

4. The organic electroluminescent display device according to claim 1,
 wherein the lamination structure includes a first capping layer and a second capping layer,
 a distance between the upper electrode and the second capping layer is larger than a distance between the upper electrode and the first capping layer,
 a refractive index of the first capping layer is larger than a refractive index of the second capping layer, and
 the light emitting material is contained at least in the first capping layer.

5. The organic electroluminescent display device according to claim 4, further comprising pixels which are adjacent to each other,
 wherein a color of each of the pixels is different from each other, and
 the first capping layer is arranged continuously in the pixels.

6. The organic electroluminescent display device according to claim 4, further comprising a blue pixel and a pixel of a color that is different from blue,
 wherein the first capping layer is arranged in the blue pixel, and is not arranged in the pixel.

7. The organic electroluminescent display device according to claim 6, wherein the second capping layer does not contain the light emitting material, and is arranged continuously in the blue pixel and the pixel.

8. The organic electroluminescent display device according to claim 7,
 wherein the second capping layer has a first thickness in a region positioned in the blue pixel and a second thickness in a region positioned in the pixel, and
 the first thickness is different from the second thickness.

9. The organic electroluminescent display device according to claim 4, further comprising a first pixel of a first color and a second pixel of a second color that is different from the first color,
 wherein the first capping layer includes:
 a first region that contains a first light emitting material to emit light of the first color and is arranged in the first pixel; and
 a second region that contains a second light emitting material to emit light of the second color, is arranged in the second pixel, and is positioned separately from the first region.

10. The organic electroluminescent display device according to claim 9, wherein a thickness of the first region is different from a thickness of the second region.

11. An organic electroluminescent display device, comprising:
 a lower electrode;
 an upper electrode;
 an organic EL layer positioned between the lower electrode and the upper electrode;

a first capping layer positioned on and in direct contact with the upper electrode; and a second capping layer positioned over the first capping layer, wherein at least one of the first capping layer and the second capping layer contains a light emitting material, and wherein a refractive index of the first capping layer is equal to or larger than 1.75.

12. An organic electroluminescent display device, comprising:

a lower electrode;

an upper electrode;

an organic EL layer positioned between the lower electrode and the upper electrode;

a first capping layer positioned on and in direct contact with the upper electrode; and a second capping layer positioned over the first capping layer, wherein at least one of the first capping layer and the second capping layer contains a light emitting material, and wherein a refractive index of the second capping layer is equal to or smaller than 1.50.

* * * * *